DEFLECTION CIRCUIT WITH BIDIRECTIONAL TRACE AND RETRACE SWITCHES

INVENTOR.
JOHN B. BECK
BY Eugene M. Whitacre
Attorney

INVENTOR
JOHN B. BECK
BY
Eugene M. Whitacre
Attorney

United States Patent Office 3,441,791

Patented Apr. 29, 1969

3,441,791

DEFLECTION CIRCUIT WITH BIDIRECTIONAL TRACE AND RETRACE SWITCHES

John B. Beck, Indianapolis, Ind., assignor to Radio Corporation of America, a corporation of Delaware Filed Oct. 6, 1966, Ser. No. 584,698
Int. Cl. H01j *29/70*
U.S. Cl. 315—27 16 Claims

ABSTRACT OF THE DISCLOSURE

A solid state deflection circuit adapted for use in a television receiver. A bidirectionally conductive trace switch couples a deflection winding to a substantially constant voltage during the trace interval of each deflection cycle and a bidirectionally conductive retrace switch couples the deflection winding and trace switch to a primary voltage supply during retrace. The trace switch is turned off and energy is supplied to the deflection winding during retrace.

Figure 1:
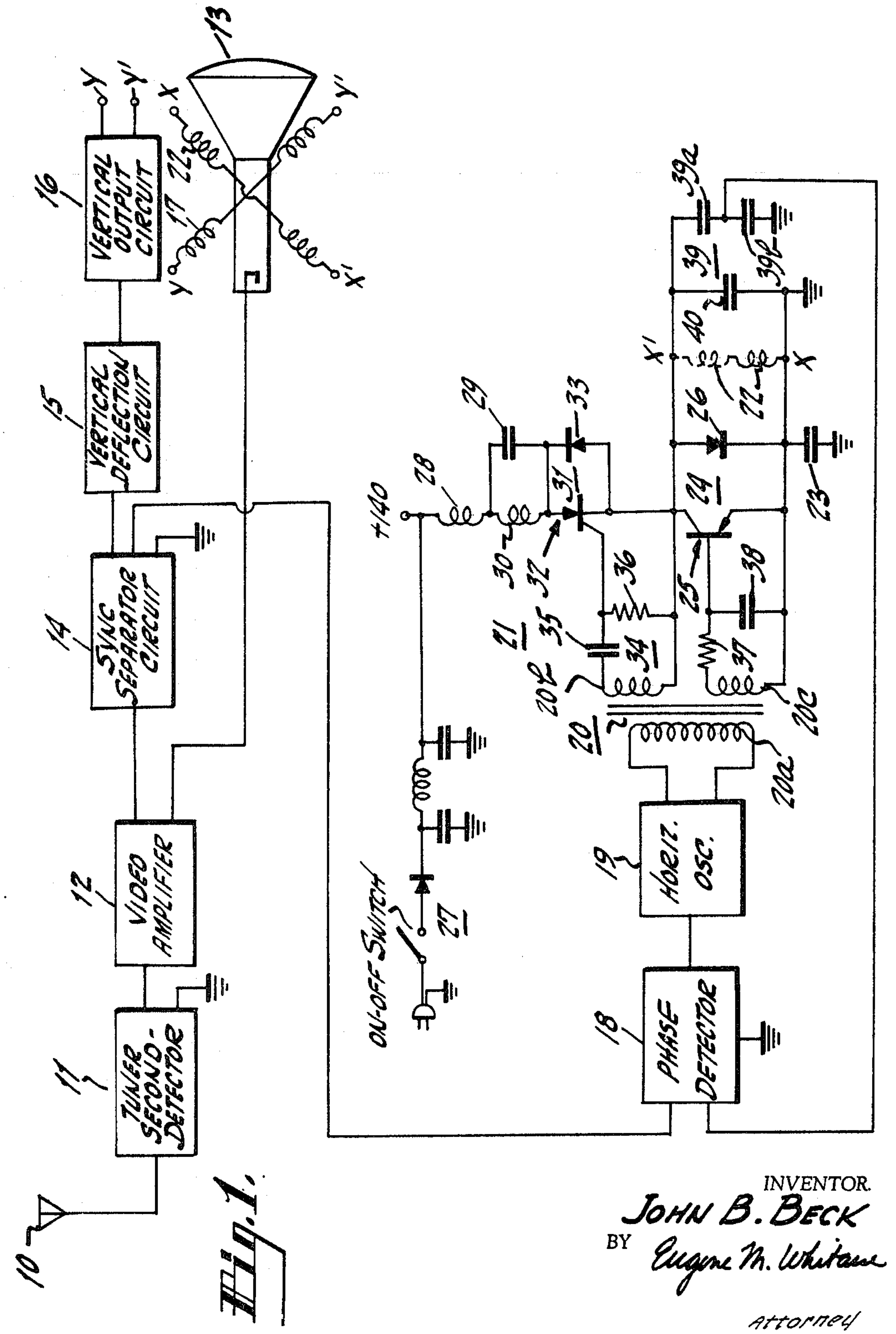

This invention relates to electron beam deflection circuits and, in particular, to a deflection circuit utilizing a plurality of solid state semiconductor devices including one or more silicon controlled rectifiers.

The invention is particularly useful in connection with horizontal deflection circuits for television receivers and will be described further in connection with use in such apparatus.

Numerous circuit designs for completely transistorized television receivers either have been incorporated in commercially available receivers or have been described in detail in various technical publications. One of the most troublesome areas in such transistor receivers, from the point of view of reliability and economy, lies in the horizontal deflection circuits.

Present commercially available transistors which are sufficiently economical for use in a television receiver generally require inclusion in the receiver of a relatively costly step-down transformer in the power supply to provide the low operating voltages required by such transistors. Furthermore, complex protection circuits have been found to be necessary to prevent failure of such transistors when subjected to the relatively large reverse voltages encountered in television horizontal deflection circuits.

In an attempt to avoid the voltage and current limitations of transistor deflection circuits, circuits have been proposed utilizing the silicon controlled rectifier (SCR), a semiconductor device capable of operation with substantially higher currents and voltages than transistors.

One type of SCR deflection circuit heretofore proposed is the retrace driven type wherein a single SCR is connected to a supply during the relatively short retrace portion of the deflection cycle to replenish the energy dissipated in an associated deflection yoke or winding during the trace portion of the cycle. In the retrace driven circuit, a relatively high unidirectional current is passed through the SCR and associated deflection components during the retrace time and a substantially linearly varying unidirectional deflection current is passed, for example, through a diode during trace. The resulting relatively high unidirectional current produces power losses in the resistive components associated with the deflection system. Such a retrace driven circuit is generally of lower efficiency than the more conventional trace driven circuit commonly employed in vacuum tube or transistor deflection systems. In the trace driven circuit, one or more active devices, which serve as a switch, conduct bidirectionally during the relatively long trace portion of the deflection cycle, returning energy to the yoke during the latter half of trace and substantially reducing the direct current and associated power losses described above.

It is an object of the present invention to provide a relatively high efficiency deflection circuit for television receivers utilizing reliable, high speed solid state switching devices capable of operation from a voltage supply which does not require inclusion in the receiver of a costly power transformer.

It is a further object of the present invention to provide a relatively high efficiency horizontal deflection circuit for television receivers utilizing a bidirectionally conductive combination of solid state switching devices for coupling the deflection winding to a source during the trace portion of the deflection cycle, avoiding the use of high unidirectional currents, and furthermore providing a separate semiconductor retrace switch, the combination avoiding problems associated with subjecting transistor devices to high reverse voltages during retrace.

In accordance with the invention, a low power dissipating, reliable retrace driven deflection circuit comprises at least one solid state controlled rectifier which is rendered conductive during retrace and operates in conjunction with a bidirectionally conductive combination of solid state devices which serve as a trace switch for providing a sawtooth current waveform to a deflection winding.

Figure 2:
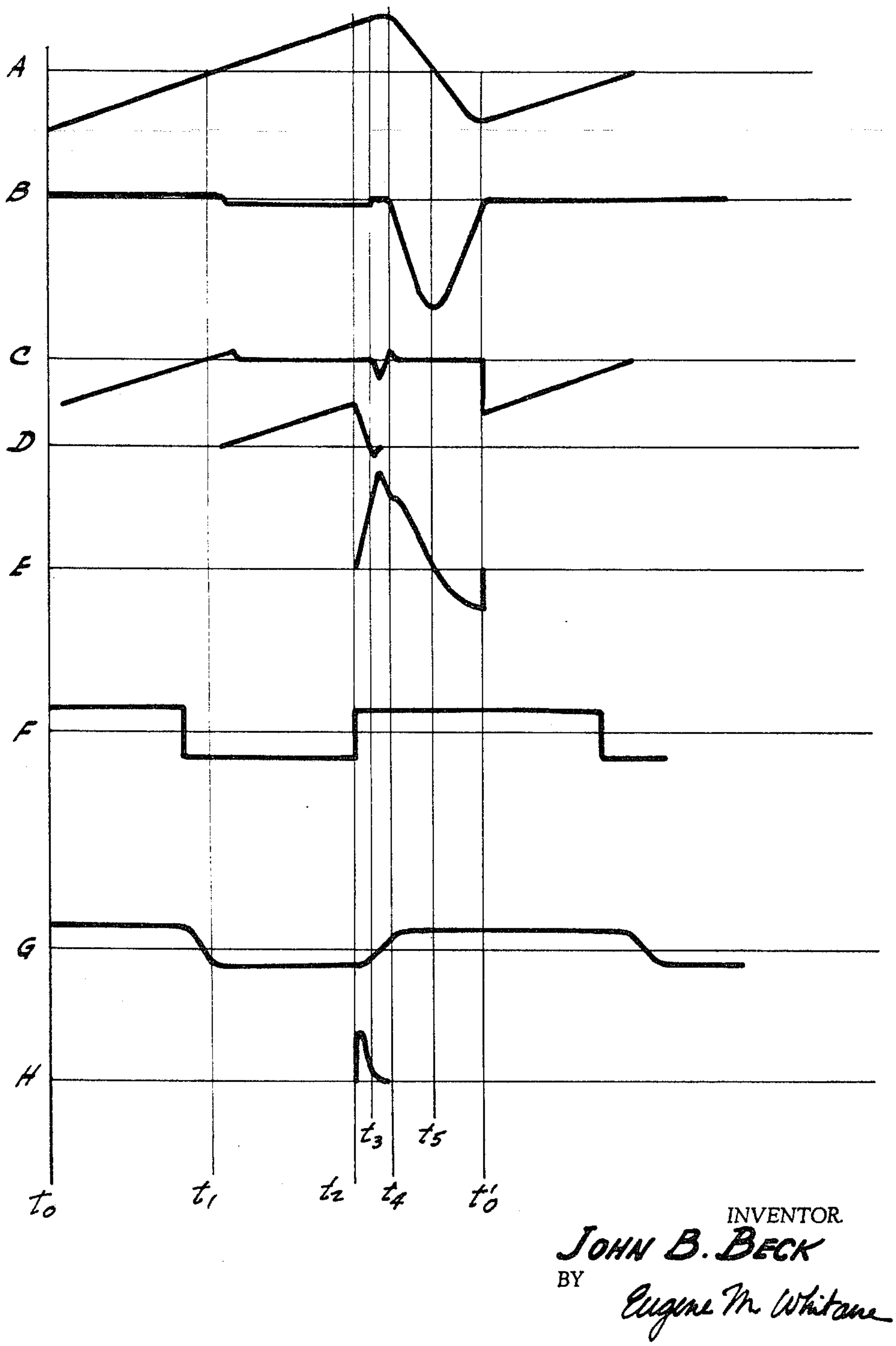

The novel features that are considered characteristic of this invention are set forth with particularity in the appended claims. The invention, itself, however, both as to its organization and method of operation, as well as additional objects and advantages thereof, will best be understood from the following description when read in connection with the accompanying drawings, in which:

FIGURE 1 is a schematic circuit diagram, partially in block diagram form, of a television receiver embodying the invention; and FIGURE 2 is a series of waveform diagrams (not drawn to scale) to which reference will be made in the explanation of the operation of the circuit of FIGURE 1.

Referring now to FIGURE 1 of the drawing, an embodiment of the invention will be described as it may be used in a typical television receiver. The television receiver includes an antenna 10 which receives composite television signals and couples the received signals to a tuner-second detector 11. The tuner-second detector 11 normally includes radio frequency signals to intermediate frequency signals, an intermediate frequency amplifier and a detector for deriving composite television signals from the intermediate frequency signals. The television receiver further includes a video amplifier 12.

The amplified image brightness-representative portion of the composite television signal produced by video amplifier 12 is applied to the control electrode (e.g. the cathode) of a television kinescope 13. The composite television signal is also applied from video amplifier 12 to a synchronizing signal separator circuit 14. The sync separator circuit 14 supplies vertical synchronizing pulses to a vertical deflection signal generator 15. Vertical deflection signal generator 15 is connected to a vertical deflection output circuit 16, terminals Y–Y' of which are connected to a vertical deflection winding 17 associated with kinescope 13.

Horizontal synchronizing pulses are derived from sync separator circuit 14 and are supplied to a phase detector 18, the latter also being supplied with a second signal related in time occurrence to the operation of a horizontal oscillator 19. An error voltage is developed in phase detector 18 and applied to horizontal oscillator 19 to synchronize the output of the latter with the horizontal synchronizing pulses. The output wave developed by horizontal oscillator 19 is supplied by means of a transformer 20 including a primary winding 20*a* and first and second secondary windings 20*b* and 20*c* to a horizontal deflection circuit 21 constructed in accordance with the present invention.

Deflection circuit 21 serves to produce in a horizontal deflection winding 22 a sawtooth deflection current waveform having a trace portion and a retrace portion as will be explained more fully below.

In deflection circuit 21, a first means for storing and transferring electrical energy comprising a relatively large capacitor 23, across which there is developed a relatively constant voltage, is coupled to deflection winding 22 during the trace portion of each deflection cycle by means of a controllable bidirectionally conductive switching means 24. In the embodiment shown, switching means 24 comprises the parallel combination of a transistor 25 and a damper diode 26, diode 26 being arranged to conduct current in a direction opposite to the preferred direction of conduction of transistor 25.

The deflection circuit 21 further comprises a second source of electrical energy shown as a transformerless B+ voltage supply 27 (e.g. +140 volts) provided for the television receiver. Reactive circuit means comprising the series combination of an inductance 28 and a capacitance 29, the capacitance 29 being coupled in parallel with a relatively large inductance 30, is coupled at one end to the +140 volt terminal of the B+ voltage supply 27.

A second controllable bidirectionally conductive switching means 31 is coupled in series between the series combination mentioned above and the first switching means 24. The switching means 31 comprises a parallel combination of a silicon controlled rectifier (SCR) 32 and an energy recovery diode 33, diode 33 being arranged to conduct current in a direction opposite to the direction of conduction of SCR 32.

Circuit means are provided for rendering switching means 31 conductive immediately prior to and during the retrace portion of each deflection cycle and for rendering transistor 25 of switching means 24 conductive during the last half of the trace portion of each deflection cycle. The former circuit means comprises winding 20*b* of transformer 20 to which there is coupled a differentiating network 34 including a capacitor 35 and a resistor 36. The junction of capacitor 35 and resistor 36 is coupled to the gate electrode of SCR 32.

The latter circuit means mentioned above comprises winding 20*c* of transformer 20 to which there is coupled an integrating network including a resistor 37 and a capacitor 38. The junction of capacitor 38 and resistor 37 is coupled to the base electrode of transistor 25.

A capacitive divider 39 having first and second capacitors 39*a* and 39*b* is coupled across the deflection winding 22. The junction point of capacitors 39*a* and 39*b* is coupled to phase detector 18 to provide flyback or retrace pulses to phase detector 18 for controlling the operation of oscillator 19.

A retrace capacitor 40 is coupled in parallel with deflection winding 22.

In the operation of the receiver shown in FIGURE 1, a television signal at radio frequency is received by antenna 10. The received signal is amplified, converted to an intermediate frequency, further amplified and then detected by means of tuner-second detector 11. The image-representative portions of the signal are then amplified in video amplifier 12 and amplified video signals are applied to kinescope 13. The detected television signal also is applied to synchronizing signal separator circuit 14. Sync separator circuit 14 separates the deflection synchronizing signals from the composite television signal and supplies vertical synchronizing signals to vertical deflection signal generator 15 and horizontal synchronizing signals to phase detector 18. Output pulses generated by vertical deflection signal generator 15 are supplied to vertical deflection output circuit 16 which, in turn, supplies a suitable sawtooth of current at field frequency to the vertical deflection winding 17 coupled across terminals Y–Y'.

Retrace pulses generated across capacitor 39*b* of divider 39, which are related in time occurrence to the signals generated by horizontal oscillator 19 (at a normal frequency of 15,750 cycles per second) are applied to phase detector 18. The retrace pulses (or a waveform derived therefrom) are compared in phase detector 18 with the horizontal synchronizing pulses supplied from sync separator circuit 14. Phase detector 18 develops an error voltage which, in turn, is applied to horizontal oscillator 19 to control the oscillator phase and frequency.

The horizontal output pulses produced by oscillator 19 have a repetition rate of 15,750 cycles per second and a predetermined time relationship, as will be pointed out more fully below, with respect to the horizontal blanking or retrace interval.

The horizontal output pulses are shaped and are then applied to the gate electrode of the silicon controlled rectifier 32. The silicon controlled rectifier 32, as will be described more fully below, initiates a sequence of events which results in producing the retrace portion of the horizontal deflection cycle each time a pulse is applied to the gate electrode.

Referring to FIGURE 2, current and voltage waveforms at various points in the circuit of FIGURE 1 are shown for two complete deflection cycles. The trace portion of a deflection cycle is indicated as occurring during the time interval $t_0$ to $t_4$ while the retrace portion of the cycle occurs during the interval $t_4$ to $t_{0'}$. Typically, the interval $t_0$ to $t_4$ is about 53 microseconds in duration while the interval $t_4$ to $t_{0'}$ is about 10.5 microseconds in duration.

In the horizontal deflection circuit 21, the operation of the first or trace switching means 24 now will be considered. The trace switching means 24 is intended to operate to connect a constant voltage supply (capacitor 23) across deflection winding 22 throughout the trace portion of the deflection cycle. Specifically, beginning at the time $t_0$ (start of trace), the current in deflection winding 22 (waveform A) is at a maximum amplitude flowing in the direction within winding 22, for example, from terminal X to terminal X'. The voltage across the combination of winding 22 and capacitor 23 (waveform B) passes through zero and reverses (i.e. during the first part of the trace period the voltage across winding 22 exceeds that across capacitor 23). As indicated in waveform *c*, the diode 26 conducts for the first part of the trace period applying a substantially constant voltage (e.g. +14 volts) developed across capacitor 23 to the deflection winding 22. As a result, during the first half of the trace portion of the deflection cycle ($t_0$ to $t_1$), the current in deflection winding 22 (waveform A) declines in a substantially linear manner towards zero, thereby supplying energy to capacitor 23. Capacitor 23 is choosen sufficiently large so that the voltage across such capacitor does not change appreciably during a cycle of operation. Approximately midway through the trace portion of the cycle (i.e. at time $t_1$), the current through deflection winding 22 reverses and switches from damper diode 26 to transistor 25 (see waveform D—transistor current). In preparation for this switching of current paths, transistor 25 is placed in a "standby" condition prior to the second half of trace by means of a signal (waveform G) provided via winding 20*c*, resistor 37 and capacitor 38 to its base electrode.

The manner in which the standby signal is produced will be explained below. The polarity of the portion of the standby signal occurring during trace is arranged to enable conduction in transistor 25 when the main (emitter-collector) conduction path is forward biased. This latter condition takes place approximately midway through trace (e.g. at $t_1$) so that deflection current is transferred from diode 26 to transistor 25 at that time. The deflection current in winding 22 then increases from zero in a substantially linear manner during the latter half of trace as such current passes through transistor 25. Energy is extracted from capacitor 23 and transferred to deflection winding 22 during this interval.

During the trace interval, energy is transferred from inductance 30 to capacitor 29, resulting in the production across SCR 32 of voltage in excess of that provided by the B+ supply 27. The energy initially is stored in inductance 30, as will appear from the discussion below, during the time interval wherein switch 31 is closed (conductive).

The oscillator 19 produces a square wave (waveform F), which is differentiated by network 34 to produce a trigger pulse (waveform H). The leading edge of the trigger pulse occurs at time $t_2$ which is approximately one to three microseconds before the end of the trace period. This trigger pulse is applied to the gate electrode of the SCR 32 to initiate a sequence of events leading to the occurrence of the retrace portion of the deflection cycle. Specifically, when SCR 32 is triggered into conduction, a closed circuit path comprising the first switching means 24, second switching means 31, inductor 28, capacitor 29 and B+ supply 27 is completed. The current in deflection winding 22 continues to increase linearly since the switch 24 remains closed and couples capacitor 23 across winding 22. At the same time, a substantial increasing current (waveform E) flows in the above-mentioned closed circuit path in the forward direction through SCR 32 and in the reverse direction through transistor 25, the latter being possible since a substantial forward current (that of winding 22) also is flowing through transistor 25. The current through SCR 32, however, increases more rapidly than the deflection current since the resonant period of inductance 28 and capacitor 29 is relatively short compared to that of the combination of winding 22, capacitor 29 and capacitor 40. Therefore, after a predetermined short time interval (e.g. 2 to 3 microseconds) the net current through transistor 25 passes through zero (see waveform D). The base electrode of transistor 25 is then reverse biased by the waveform G applied from oscillator 19, via winding **20*c* and integrating network 37, 38 maintaining transistor 25 cut off. The current from supply 27, which continues to increase, then switches to diode 26 for a short interval until the deflection and supply currents are again equal. At that time, diode 26 and transistor 25 both are switched "off" (i.e. to high impedance state) thereby "disconnecting" winding 22 from the constant trace voltage supply (i.e. capacitor 23**). The retrace interval commences at this time ($t_4$).

The time interval ($t_3$ to $t_4$) during which current passes through diode 26 is arranged to be of sufficient duration to permit recharging of capacitor 23 to restore energy lost due to dissipation in the circuit during the remainder of each deflection cycle. The necessary direct current is supplied via the large inductance 30 which by-passes capacitor 29. It should also be noted that the last-mentioned interval permits transistor 25 to completely cease conduction before the initiation of retrace. The possibility of current flowing in transistor 25 when the substantial retrace voltage appears across transistor 25 therefore is substantially eliminated.

During the initial half of the retrace interval, the voltage across winding 22 increases negatively while the deflection current (which now passes in part through switch 31 and in part through capacitor 40) declines toward zero. The current and voltage associated with winding 22 vary at a rate determined by the series combination of inductance 28 and capacitor 29 coupled in parallel with both winding 22 and capacitor 40. The total parallel combination is arranged to provide substantially one-half cycle of oscillation during the retrace interval. Capacitor 29 which was charged during trace to a voltage substantially greater than B+, as a result of an exchange of energy with inductor 30, discharges through switch 31 supplying energy to deflection winding 22 and capacitor 40. When, as a result of the presence of inductance 28 and capacitor 29, the current through switch 31 reverses in direction (i.e. at $t_5$), SCR 32 is cut off and diode 33 commences conduction. Energy is returned to supply 27 via diode 33 during this interval ($t_5$ to $t_{0'}$).

When the voltage across winding 22 passes through slightly more than one-half cycle, diode 26 is once again forward biased, coupling capacitor 23 across winding 22 and thereby initiating the trace portion of the next deflection cycle.

In the preceding discussion, the waveforms G and H applied to the base electrode of transistor 25 and the gate elctrode of SCR 32, respectively, were described as being derived from the output of oscillator 19 (waveform F). Specifically, oscillator 19 provides a square wave output having a first relatively sharp transition prior to the middle of trace (i.e. prior to time $t_1$) and further having a second relatively sharp transition coincident with the desired turn on time of SCR 32 (i.e. at time $t_2$).

The differentiating network 34 serves to modify the waveform F to provide a positive trigger pulse (waveform H) at $t_2$ for application to the gate electrode of SCR 32 (the negative pulse which is produced at the earlier transition of waveform F is not shown since it has no effect on the operation of SCR 32).

The integrating networks 37, 38 associated with transistor 25 serves to "round off" the output of oscillator 19 so as to produce the relatively gradual transition shown at waveform G. In effect, the change of polarity of waveform G is delayed with respect to the polarity changes of waveform F while the trigger pulse (waveform H) is substantially coincident with the change of polarity of waveform F. As a result, the base electrode of transistor 25 is reverse biased several microseconds after SCR 32 is turned on, thereby permitting some time interval for the current intransistor 25 to decrease to zero before the base electrode is reverse biased. It is advantageous, however, to arrange to apply such reverse bias before the beginning of retrace (i.e. before $t_4$) to insure cut off of transistor 25 before it is subjected to retrace voltage pulses (waveform B). Furthermore, the timing of oscillator 19 should be arranged so as to produce the opposite transition sufficiently in advance of $t_1$ to insure that transistor 25 is biased for conduction as the deflection current (waveform A) crosses through zero.

While the invention has been described in connection with a particular embodiment of the invention, it will be recognized that various modifications within the scope of the invention can be made.

For example, transistor 25 may be replaced by a second silicon controlled rectifier. In that case, an appropriate waveform for triggering the second SCR would be derived from oscillator 19 (or some other source).

It should also be noted that the voltage appearing across capacitor 23 (a substantially constant voltage), may be utilized by other portions of the receiver if desired.

What is claimed is:

1. In a television receiver, an electron beam deflection circuit for producing a sawtooth deflection current waveform having a trace portion and a retrace portion, the circuit comprising a beam deflection winding, charge storage means for providing a substantially constant voltage, controllable bidirectionally conductive trace switching means for coupling said charge storage means to said winding substantially throughout the trace portion of each deflection cycle, said trace switching means comprising the parallel combination of a diode and a controllable semiconductor device having a preferred direction of conduction, said diode being coupled across said device for conduction in a direction opposite said preferred direction, a voltage source, and controllable retrace switching means selectively operable for coupling said voltage source in series with said trace switching means to initiate the retrace portion of each deflection cycle.

2. In a television receiver, an electron beam deflection circuit according to claim 1 wherein said charge storage means, trace switching means and retrace switching means are coupled in series relation across said voltage source, said retrace switching means being operable to transfer energy from said source to said charge storage means during the retrace portion of each deflection cycle.

3. In a television, an electron beam deflection circuit according to claim 2 wherein said trace and retrace switching means are arranged for opposite directions of conduction at the end of the trace portion of each deflection cycle.

4. In a television receiver, an electron beam deflection circuit according to claim 3 and further comprising triggering means for periodically rendering said trace switching means conductive during each said trace portion and for periodically rendering said retrace switching means conductive prior to and during each said retrace portion.

5. In a television receiver, an electron beam deflection circuit for producing a sawtooth deflection current waveform having a trace portion and a retrace portion, the circuit comprising a beam deflection winding, charge storage means for providing a substantially constant voltage, controllable bidirectionally conductive trace switching means for coupling said charge storage means to said winding substantially throughout the trace portion of each deflection cycle, a voltage source, controllable retrace switching means comprising the parallel combination of a semiconductor controlled rectifier and a diode disposed in oppositely conductive directions one with respect to the other selectively operable for coupling said voltage source in series with said trace switching means to initiate the retrace portion of each deflection cycle, and triggering means for periodically rendering said trace switching means conductive during each said trace portion and for periodically rendering said retrace switching means conductive prior to and during each said retrace portion, said trace and retrace switching means being arranged for opposite directions of conduction at the end of the trace portion of each deflection cycle and said charge storage means, trace switching means and retrace switching means are coupled in series relation across said voltage source, said retrace switching means being operable to transfer energy from said source to said charge storage means during the retrace portion of each deflection cycle.

6. In a television receiver, an electron beam deflection circuit according to claim 5 wherein said controlled rectifier is arranged in series relation with said trace switching means for conduction in a direction opposite the direction of conduction of said trace switching means at the end of the trace portion of each deflection cycle.

7. In a television receiver, an electron beam deflection circuit according to claim 6 and further comprising a series resonant combination of inductance and capacitance in series relation with said controlled rectifier and said voltage source.

8. In a television receiver, an electron beam deflection circuit for producing a sawtooth deflection current waveform having a trace portion and a retrace portion, the circuit comprising a beam deflection winding, a first energy storage means for supplying a substantially constant voltage, a controllable bidirectionally conductive trace switching means for coupling said energy storage means to said winding substantially throughout the trace portion of each deflection cycle, said trace switching means comprising the parallel combination of a diode and a controllable semiconductor device having a preferred direction of conduction, said diode being coupled across said device for conduction in a direction opposite said preferred direction, a voltage source, a series resonant combination of inductance and capacitance, and controllable retrace switching means selectively operable for coupling said voltage source, said series resonant combination and said trace and retrace switching means in series to initiate the retrace portion of each deflection cycle.

9. In a television receiver, an electron beam deflection circuit according to claim 8 wherein said retrace switching means comprises a semiconductor controlled rectifier.

10. In a television receiver, an electron beam deflection circuit according to claim 9 and further comprising a retrace capacitor coupled in parallel relation with said deflection winding and resonant therewith for permitting reversal of the direction of current through said winding during said retrace portion.

11. In a television receiver, an electron beam deflection circuit for producing a sawtooth deflection current waveform having a trace portion and a retrace portion, the circuit comprising a beam deflection winding, a first energy storage means for supplying a substantially constant voltage, a controllable bidirectionally conductive trace switching means for coupling said energy storage means to said winding substantially throughout the trace portion of each deflection cycle, a voltage source, a series resonant combination of inductance and capacitance, and controllable retrace switching means comprising a semiconductor controlled rectifier and a diode coupled in parallel with said controlled rectifier in oppositely conductive direction with respect to said rectifier selectively operable for coupling said voltage source, said series resonant combination, and said trace and retrace switching means in series to initiate the retrace portion of each deflection cycle.

12. In a television receiver, an electron beam deflection circuit according to claim 11 wherein said voltage source comprises positive and negative terminals and said first energy storage means comprises a relatively large capacitor coupled in series relation between said trace switching means and said negative terminal of said voltage source.

13. In a television receiver, a deflection circuit according to claim 12 and further comprising triggering means for periodically rendering said trace switching means conductive for deflection current during the latter half of said trace portion and for rendering said retrace switching means conductive to pass current through said trace switching means in a direction opposite to that of said deflection current to initiate the retrace portion of each deflection cycle.

14. In a television receiver, a deflection circuit according to claim 13 wherein said trace switching means comprises the parallel combination of a diode and a controllable semiconductor device having a preferred direction of conduction, said diode being coupled across said device for conduction in a direction opposite said preferred direction.

15. In a television receiver, a deflection circuit accord-to claim 14 wherein said series circuit is arranged to provide, during conduction by said retrace switching means, current exceeding and opposite in direction to deflection current in said trace switching means.

16. In a television receiver, a deflection circuit according to claim 14 wherein said semiconductor device comprises a transistor.

References Cited

UNITED STATES PATENTS 3,323,001 5/1967 Mackellar ----------- 315—27

RODNEY D. BENNETT, Jr., *Primary Examiner.*

J. G. BAXTER, *Assistant Examiner.*